(12) United States Patent
Houston et al.

(10) Patent No.: US 6,563,158 B1
(45) Date of Patent: May 13, 2003

(54) METHOD AND APPARATUS FOR VOLTAGE STIFFENING IN AN INTEGRATED CIRCUIT

(75) Inventors: Theodore W. Houston, Richardson, TX (US); James D. Gallia, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/039,810

(22) Filed: Nov. 16, 2001

(51) Int. Cl.[7] .................... H01L 27/108; H01L 29/76; H01L 29/94; H01L 31/119
(52) U.S. Cl. .................... 257/296; 257/300; 257/301
(58) Field of Search .................... 257/296, 300, 257/301; 365/149

(56) References Cited

U.S. PATENT DOCUMENTS 6,236,195 B1 * 5/2001 Nagatomo .................. 323/303
6,477,079 B2 * 11/2002 Kaneko et al. ............. 365/149

* cited by examiner

*Primary Examiner*—David Nelms
*Assistant Examiner*—Tu-Tu Ho
(74) *Attorney, Agent, or Firm*—Jacqueline J. Garner; W. James Brady III; Frederick J. Telecky, Jr.

(57) ABSTRACT

An integrated circuit includes several circuit portions coupled between two rails that carry respective different voltage potentials. Each circuit portion includes a relatively small capacitance, coupled in series with a resistance which is sufficient to effect substantial limiting of the magnitude of any leakage current that may flow through the capacitor.

19 Claims, 6 Drawing Sheets

METHOD AND APPARATUS FOR VOLTAGE STIFFENING IN AN INTEGRATED CIRCUIT

TECHNICAL FIELD OF THE INVENTION

This invention relates in general to techniques for regulating or stiffening a voltage and, more particularly, to techniques for regulating or stiffening a voltage within an integrated circuit.

BACKGROUND OF THE INVENTION

When implementing most circuits, it is a relatively standard practice to provide a plurality of capacitors which each have two ends coupled to respective conductive strips. These conductive strips are frequently called "rails", and carry respective different direct current voltage potentials from a power supply. The capacitors serve to regulate or "stiffen" the supply voltage by eliminating high frequency signal components, including high frequency components induced in the supply voltage by normal operation of the circuitry powered by the supply voltage.

In the context of an integrated circuit, where the voltage stiffening capacitors are parts of the integrated circuit, the capacitors are commonly implemented by providing scattered regions within the integrated circuit which are not used for the operational circuit, and then implementing in each such region a single voltage stiffening capacitor which is as large as possible. Due to process variations or other factors, one or more of the voltage stiffening capacitors in an integrated circuit may have a defect which permits a leakage current of relatively large magnitude to flow therethrough. Such defects typically arise during fabrication of the integrated circuit. However, in some cases such a defect may develop during operational use of the integrated circuit, long after it has been fabricated.

SUMMARY OF THE INVENTION

From the foregoing, it may be appreciated that a need has arisen for a method and apparatus for preventing or limiting leakage current in a voltage stiffening capacitor in an integrated circuit. A first form of the present invention involves an integrated circuit which includes: first and second conductive parts operable to respectively carry first and second supply voltages that are different; and a plurality of voltage stiffening circuit portions which each have first and second nodes respectively coupled to the first and second conductive parts, each of the circuit portions including a capacitance and a current limiting section coupled in series with each other between the first and second nodes thereof, each such current limiting section being selected so that application thereacross of a voltage equal to the difference between the first and second supply voltages would induce through the current limiting section a current flow less than approximately 10 mA.

A second form of the present invention involves an integrated circuit which includes: first and second conductive parts operable to respectively carry first and second voltages which are different; and a plurality of voltage stiffening circuit portions disposed within a contiguous area of the integrated circuit which is free of circuitry other than the circuit portions, the circuit portions each having first and second nodes respectively coupled to the first and second conductive parts, and each including a capacitance and a current limiting section coupled in series with each other between the first and second nodes thereof.

Yet another form of the present invention involves an integrated circuit which includes: first and second conductive parts operable to respectively carry first and second voltages which are different; and a plurality of voltage stiffening circuit portions which each have first and second nodes respectively coupled to the first and second conductive parts, each of the circuit portions including a capacitance and a current limiting section coupled in series with each other between the first and second nodes thereof, wherein the capacitances of the circuit portions each include first and second conductive portions separated by a nonconductive portion, the first conductive portions being electrically separate from each other, and the second conductive portions being respective integral portions of a single conductive member.

Still another form of the present invention involves an integrated circuit which includes: a dynamic random access memory section having a plurality of memory cells which each include a capacitor; first and second conductive parts operable to respectively carry first and second voltages which are different; and a plurality of voltage stiffening circuit portions which each have first and second nodes respectively coupled to the first and second conductive parts, each of the circuit portions including a capacitor and a current limiting section coupled in series with each other between the first and second nodes thereof, the capacitors of the circuit portions each having a structural configuration which is equivalent to a structural configuration of the capacitors in the dynamic random access memory section.

Another form of the present invention involves an integrated circuit which includes: first and second conductive parts operable to respectively carry first and second voltages which are different; a plurality of voltage stiffening circuit portions which each have first and second nodes respectively coupled to the first and second conductive parts, each of the circuit portions including a capacitance and a transistor coupled in series with each other between the first and second nodes thereof, each transistor having a control terminal which is responsive to application thereto of a control signal for controlling a current flow between the first and second nodes through the transistor as a function of the control signal applied thereto; and a circuit portion coupled to the control terminal of each transistor for applying thereto a control signal.

Yet another form of the present invention relates to fabrication of an integrated circuit which includes first and second conductive parts operable to respectively carry first and second supply voltages that are different, and a plurality of voltage stiffening circuit portions that each have first and second nodes respectively coupled to the first and second conductive parts, each of the circuit portions including a capacitance and a resistance coupled in series with each other between the first and second nodes thereof. Fabrication of the integrated circuit involves: providing a substrate; forming in the substrate a portion which extends between spaced first and second locations on the substrate and which implements the resistance; forming an insulating layer over the substrate; forming first and second openings in the insulating layer which respectively extend to the first and second locations; forming conductive first and second contacts in the first and second openings, the first and second contacts being respectively electrically coupled to the substrate at the first and second locations; forming in the insulating layer a recess which is spaced from the substrate, one of the first and second contacts having an upper portion which projects into the recess and the other of the contacts being spaced from the recess; forming on exposed surfaces of the recess and the one of the contacts a first conductive layer; forming a non-conductive layer on the first conductive layer; forming a second conductive layer on the non-conductive layer, the first and second conductive layers and the non-conductive layer collectively forming a capacitor which provides the capacitance of the circuit portion; and forming the first and second conductive parts so that one thereof is electrically coupled to the second conductive layer and the other thereof is electrically coupled to the other of the first and second contacts.

Still another form of the invention relates to fabrication of an integrated circuit which includes first and second conductive parts operable to respectively carry first and second supply voltages that are different, and a plurality of voltage stiffening circuit portions that each have first and second nodes respectively coupled to the first and second conductive parts, each of the circuit portions including a capacitance and a resistance coupled in series with each other between the first and second nodes thereof. Fabrication of the integrated circuit involves: providing a substrate; forming in the substrate spaced source and drain regions which have respective portions respectively disposed at spaced first and second locations on the substrate, the resistance being provided by a portion of the substrate which extends between the first and second locations; forming first and second insulating layers, the first insulating layer being provided over the substrate between the source and drain regions, and the second insulating layer being provided over the substrate above one of the first and second locations; forming a conductive gate section over the first insulating layer; forming a further conductive section over the second insulating layer, the further section, the second insulating layer and the one of the source and drain regions serving as a capacitor which provides the capacitance of the circuit portion; and forming the first and second conductive parts so that one thereof is electrically coupled to the further conductive section and so that the other thereof is electrically coupled to the substrate at one of the first and second locations which is spaced from said second insulating layer.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
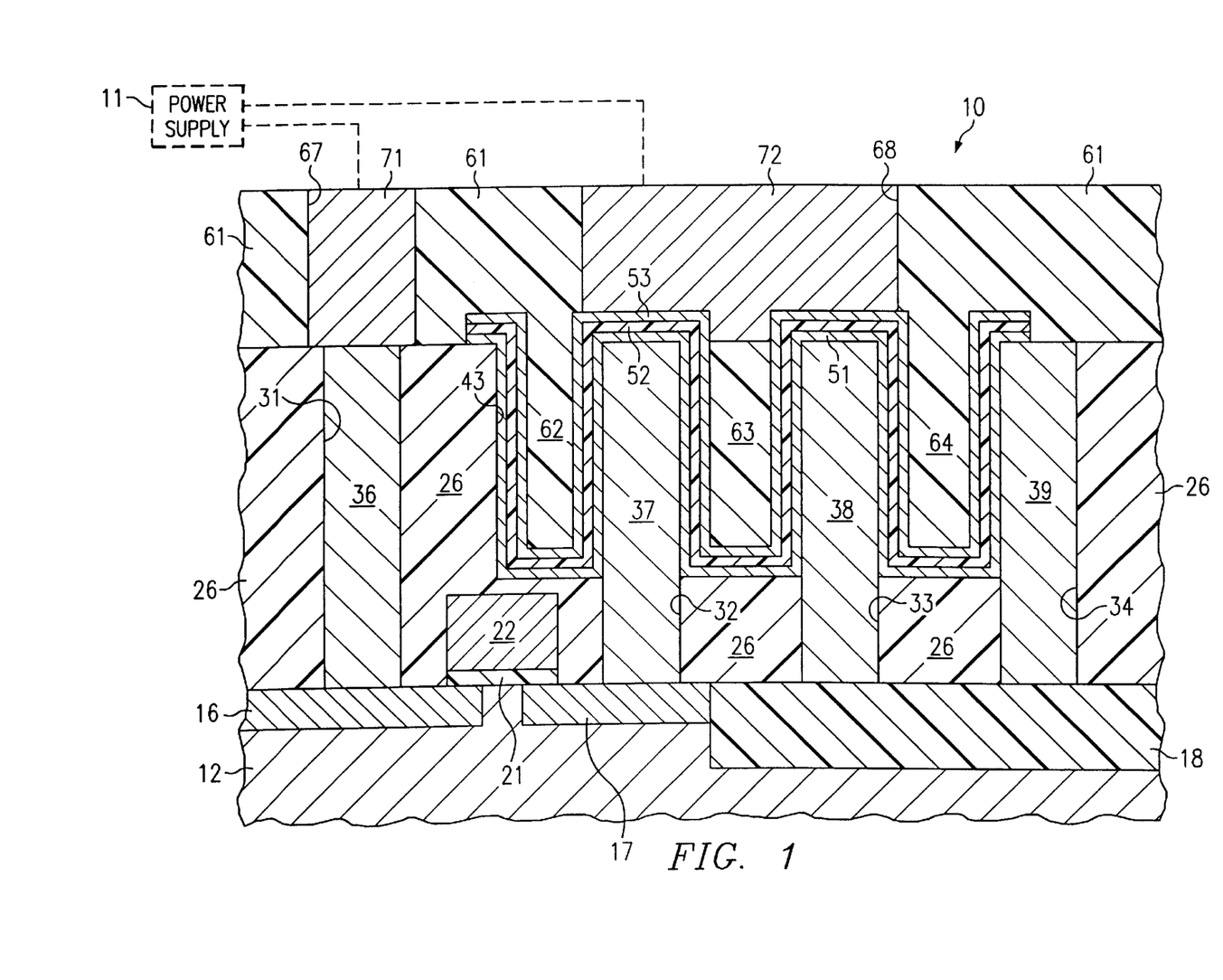
FIG. 1 is a diagrammatic fragmentary sectional side view of an integrated circuit which embodies aspects of the present invention, with a diagrammatic representation of a power supply that provides supply voltages to the integrated circuit.

FIG. 1 is a diagrammatic fragmentary sectional side view of an apparatus in the form of an integrated circuit 10, with a diagrammatic representation of a power supply 11 which provides electrical power to the integrated circuit. The following explanation of the structure of the integrated circuit 10 also includes some comments about how the integrated circuit is manufactured.

The integrated circuit 10 includes a semiconductor substrate 12 which is made of silicon. The substrate 12 has two regions 16 and 17 which are doped in a known manner, so as to respectively define source and drain regions for a field effect transistor (FET). A shallow trench isolation (STI) region 18 is also formed in the substrate 12, using known techniques, and at a location adjacent the drain region 17.

Next, a layer of a dielectric material such as silicon dioxide is formed on top of the substrate 12, and a layer of polysilicon is formed over the oxide layer. Then, both of these layers are subjected to a patterned etch in a known manner, so as to respectively form a gate oxide layer 21 and a gate 22. The oxide layer 21 and gate 22 are centered between the source and drain regions 16 and 17, and overlap slightly onto each of the source and drain regions.

Next, a layer 26 of a dielectric material such as silicon dioxide is formed over the substrate 12, the layer 21, and the gate 22. Then, the dielectric layer 26 is subjected to a patterned etch using known techniques, in order to create several vertical openings 31–34 which each extend completely through the dielectric layer 26. The openings 31 and 32 each expose a top surface of one of the source region 16 and drain region 17, and the openings 33 and 34 each expose a portion of the top surface of the STI region 18.

Figure 2:
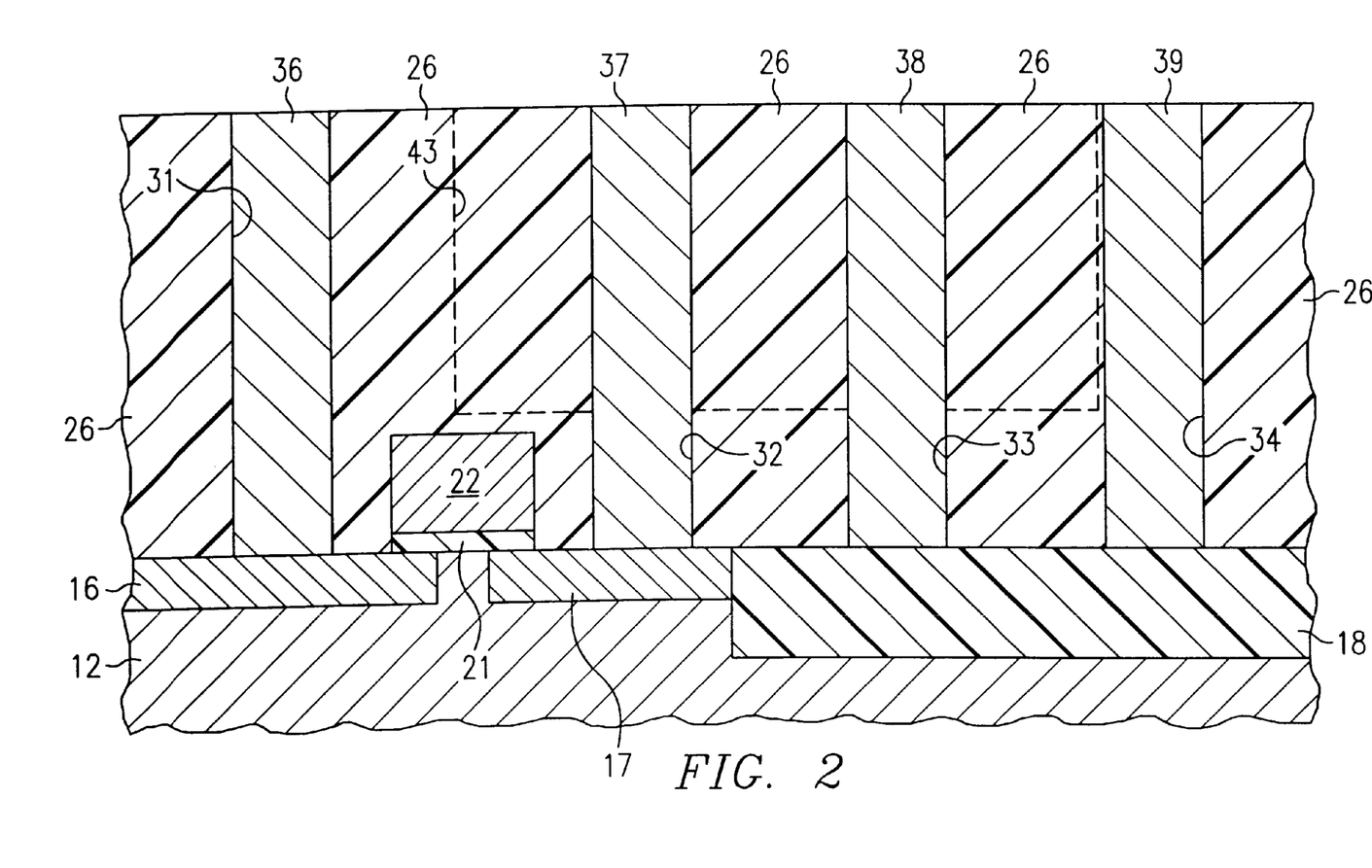
FIG. 2 is a diagrammatic fragmentary sectional side view similar to FIG. 1, showing a portion of the integrated circuit of FIG. 1 at an intermediate stage during its fabrication.

Next, a layer of a conductive material such as tungsten is applied over the dielectric layer 26, in a manner which fills each of the openings 31–34. This conductive layer is then planarized to the top of the dielectric layer 26, using a known planarization technique such as chemical mechanical polishing (CMP). Consequently, the only portions of the conductive layer which remain are respective separate portions 36–39, which are each disposed in a respective one of the openings 31–34, and which serve as contacts. The contacts 36 and 37 are actual contacts. The contacts 38 and 39 engage the top surface of the STI region 18, and the contacts 38–39 are "dummy" contacts because the STI region is non-conductive. At this point in the fabrication process, the integrated circuit has the appearance shown in FIG. 2, where FIG. 2 is a diagrammatic fragmentary sectional side view similar to FIG. 1, but showing the apparatus of FIG. 1 in an intermediate stage during its fabrication.

Next, a well or recess 43 is formed in the dielectric layer 26. The recess 43 is indicated in FIG. 2 by a broken line. The recess 43 is formed through use of a patterned etch, where the etch is selective and removes material of the dielectric layer 26, but not material of the contacts 36–39. The recess 43 does not extend all of the way through the dielectric layer 26. Instead, the bottom surface of the recess 43 is positioned vertically higher than the top surface of the gate 22. The upper portions of the contacts 37 and 38 project upwardly into the recess 43, without engaging any of the surfaces of the recess 43.

Referring again to FIG. 1, a thin layer of a conductive material such as tantalum nitride (TaN) is sputtered over the integrated circuit structure, in a manner so that the layer covers exposed surfaces of the recess 43 and the upper portions of contacts 37 and 38, with a relatively uniform thickness. Next, a thin layer of a dielectric material such as tantalum pentoxide ($Ta_2O_5$) is sputtered with a uniform thickness over the conductive layer, and then a further thin conductive layer of copper is sputtered with uniform thickness over the non-conductive layer. A photolithographically patterned etch of these three layers is then carried out using known techniques, thereby-leaving portions of these three layers which are respectively designated by reference numerals 51–53 in FIG. 1. Before the copper layer 53 is applied, the top of the dielectric layer 52 may be passivated with tantalum nitride. The layers 51–53 collectively serve as a capacitor, as discussed later.

Next, a further layer 61 of a dielectric material such as silicon dioxide is deposited over the top of the entire structure, in a manner so that recesses defined by the layer 53 are filled by portions 62–64 of the dielectric layer 61. Then, two elongate trenches 67 and 68 are etched through the dielectric layer 61, the trench 67 exposing the upper end of the contact 36, and the trench 68 exposing two spaced portions of a top surface of the conductive layer 53. Then, a layer of conductive material such as copper is applied over the top of the structure, in a manner so as to fill the trenches 67 and 68 with respective portions 71 and 72 of the conductive material. Then, this conductive layer is planarized down to a level corresponding to the top surface of the dielectric layer 61, thereby leaving only the portions 71 and 72 of the conductive material that are disposed within the trenches 67 and 68. The conductive portions 71 and 72 are commonly called "rails".

The power supply 11 is a circuit of a known type, which in the embodiment of FIG. 1 is not a part of the integrated circuit 10. During operational use of the integrated circuit 10, the power supply 11 supplies to each of the rails 71 and 72 a respective different direct current (DC) voltage potential. These voltages serve as a source of power for operational circuitry disposed within the integrated circuit 10.

In the embodiment of FIG. 1, the FET functions primarily as a resistor, rather than as a transistor. More specifically, the source and drain regions 16 and 17, and the portion of the substrate 12 located between them, serve as a resistance with respect to current flowing between the contacts 36 and 37. This is the source-to-drain resistance of the FET. Although it is typical to form a silicide on the surfaces of source and drain regions that are engaged by contacts, in order to minimize contact resistance, no silicide is formed on the top surfaces of the source region 16 and drain region 17, because the added resistance is desirable in the embodiment of FIG. 1.

Although it is not visible in FIG. 1, there is an electrical connection to the gate 22 of the FET. The voltage at the gate 22 is selected to have a value which provides a desired current limiting effect. For example, in the case of an enhancement mode n-channel transistor, a positive gate-to-source voltage is applied in order to create a conducting channel. As another example, in the case of a depletion mode n-channel transistor, with n+source and drain regions and an n-channel, a zero gate-to-source voltage can be used, so that the transistor essentially forms a diffusion resistor. In each case, of course, the precise voltage selected will depend on a variety of factors, including dimension characteristics in the transistor, and the desired resistance value or current limit value.

The value of the resistance between the contacts 36 and 37 is selected so that, in the event a voltage equal to the voltage differential between the rails 71 and 72 was applied directly across the resistance defined by the FET, the current induced to flow through the resistance would be less than approximately 10 mA, and typically less than 1 $\mu$A. As some specific examples, where the voltage differential is 1 volt, a resistance of 1K ohm limits the current to 1 mA, and a resistance of 1M ohm limits the current to 1 $\mu$A. As a practical matter, the capacitor defect causing the leakage current will typically have some resistance, and the circuit may also include some parasitic resistances along the current path, and therefore the resistance added between the contacts 36 and 37 for the purpose of limiting leakage current can be reduced by a differential corresponding to the sum of these other resistances, so that the total resistance has the desired value.

As noted above, the layers 51–53 define a capacitor. This capacitor has a three-dimensional shape, which is evidenced by its serpentine appearance in FIG. 1, and which reflects the fact that it is formed on the exposed surfaces of the recess 43 and the contacts 37–38. For example, it will be noted that the provision of the dummy contact 38 in FIG. 1 helps to increase the area of the capacitor defined by layers 51–53, and thus the capacitance of this capacitor. Therefore, the three-dimensional shape of the capacitor helps to maximize the capacitance that can be achieved within a given area of the integrated circuit. This capacitance has a value less than approximately 100 fF and, in the embodiment of FIG. 1, has a capacitance of about 10 fF. This capacitance value is centered within a range which is approximately 1 fF to approximately 20 fF.

It will be noted from FIG. 1 that the rail 72 is coupled to the layer 53 of the capacitor, the layer 51 of the capacitor is coupled by contact 37 to one end of the source-to-drain resistance within the FET, and the other end of the resistance is coupled by contact 36 to the rail 71. Thus, the capacitor defined by layers 51–53 is coupled in series with the source-to-drain resistance of the FET between the two rails 71 and 72. The capacitance and resistance thus define an RC circuit, and this RC circuit has a time constant which is a value equal to the capacitance value times the resistance value. As mentioned above, the embodiment of FIG. 1 has a capacitance of about 10 fF and a resistance of about 1K ohm, and thus has a time constant of 10 psec (because 10 fF*1K ohm=10 psec).

The values of the capacitance and resistance can, of course, be varied to some extent without departing from the scope of the present invention, provided the variation of both is coordinated so as to maintain a suitable time constant (based on the product of their values). It is advantageous if the time constant is less than approximately 10 nanoseconds. Further, the time constant will typically be less than a time constant associated with the voltages supplied to the rails 71 and 72, which is a time constant determined by characteristics of circuitry with the power supply 11.

During use of the integrated circuit 10, the power supply 11 and the distribution of the supply voltages cause respective voltages to be applied to each of the rails 71 and 72, and the capacitor defined by the layers 51–53 serves to regulate or "stiffen" the voltages on the rails 71–72, by effectively coupling the rails 71–72 to each other with respect to high frequency signal components such as noise, while isolating the rails from each other with respect to DC and low frequency signal components.

In some circumstances, however, the capacitor defined by the layers 51–53 can be subject to the flow therethrough of an excessive DC "leakage" current. Typically, this represents a manufacturing defect, for example where the non-conductive layer 52 has a portion which is too thin.

However, it is also possible for such a defect to develop during normal operational use. In either case, the DC leakage current flowing through the capacitor also necessarily flows between the contacts 31 and 32 through the source-to-drain resistance of the FET. This source-to-drain resistance has a value, as discussed previously, which is sufficiently large to limit the magnitude of the DC leakage current through the capacitor to a value which is less than approximately 10 mA. Consequently, the magnitude of the leakage current is controlled in an effective manner, so that the integrated circuit may operate satisfactorily and efficiently even when there is a defect in a voltage stiffening capacitor which permits the flow of a leakage current.

As the RC time constant of the RC circuit portion increases, the capacitor defined by the layers 51–53 become less effective in effecting regulation or stiffening of the voltages from the power supply 11. Consequently, once a suitable value has been selected for the resistance in order to appropriately limit the magnitude of the leakage current, the capacitance must be selected to have a relatively small value in order that the RC time constant does not become so large that the capacitance is ineffective for voltage stiffening. Therefore, according to an aspect of the invention, the capacitance of the capacitor defined by the layers 51–53 is much smaller than the capacitance values of the capacitors used for voltage stiffening in preexisting integrated circuits. In order that the total rail stiffening capacitance provided within the integrated circuit 10 is of a sufficiently large value, the integrated circuit 10 includes between the rails 71 and 72 a plurality of RC circuit portions which are each equivalent to that shown in FIG. 1.

In a pre-existing integrated circuit, several different areas of the integrated circuit, which are spaced from each other, each include a single voltage stiffening capacitor having the largest size that will fit within that particular contiguous area. Thus, each such capacitor has a relatively large capacitance value. In the embodiment of FIG. 1, a plurality of smaller capacitors of significantly lower capacitance are implemented in each such contiguous area, and each such capacitance has in series with it a respective current limiting resistance. This results in a reduction in efficiency with respect to the capacitance per unit area, but it has the benefit of providing an effective way of limiting leakage current while maintaining a time constant that facilitates good voltage stiffening.

In a variation of the embodiment of FIG. 1, the gate 22 may be coupled to a fusible link of a known type, which is not illustrated. Then, if it is determined during the manufacturing process that the capacitor defined by layers 51–53 has an excessive leakage current, the fusible link can be intentionally opened at the factory so as to turn off the FET. Turning off the FET prevents any current flow through the FET, and thus prevents any flow of leakage current through the defective capacitor. If an excessive leakage current is not detected at the factory, but develops in the field through operational use, it will typically not be practical to identify the problematic capacitor and open the associated fusible link. However, the source-to-drain resistance of the FET will still be effective to limit the leakage current, in the manner described above for the embodiment of FIG. 1.

Instead of coupling the gate 22 to a fusible link, or in addition to coupling it to a fusible link, the gate 22 can be coupled to a conductor which can be controlled from externally of the integrated circuit 10. Then, during testing of the integrated circuit 10, each of the FETs used to provide resistances for voltage stiffening can be selectively and temporarily turned off in order to permit the voltage stiffening capacitors to be selectively tested for the existence and magnitude of any leakage currents.

As mentioned above, the integrated circuit 10 includes a number of RC circuit portions of the type shown in FIG. 1. It is possible to configure the integrated circuit so that several of these circuit portions are arranged in a row, and to provide a single elongate strip of polysilicon material which serves as a common gate 22 for all of the FETs in all of these circuit portions. This common gate would be coupled to a single fusible link. Then, when appropriate, the fusible link could be opened at the factory, so that the entire group of RC circuit portions would be disabled in order to eliminate a problem of excess leakage current through one or more the capacitors in that group. The integrated circuit 10 would, of course, include several other such groups of RC circuit portions, at least some of which would continue to be enabled so as to provide suitable voltage stiffening.

Figure 3:
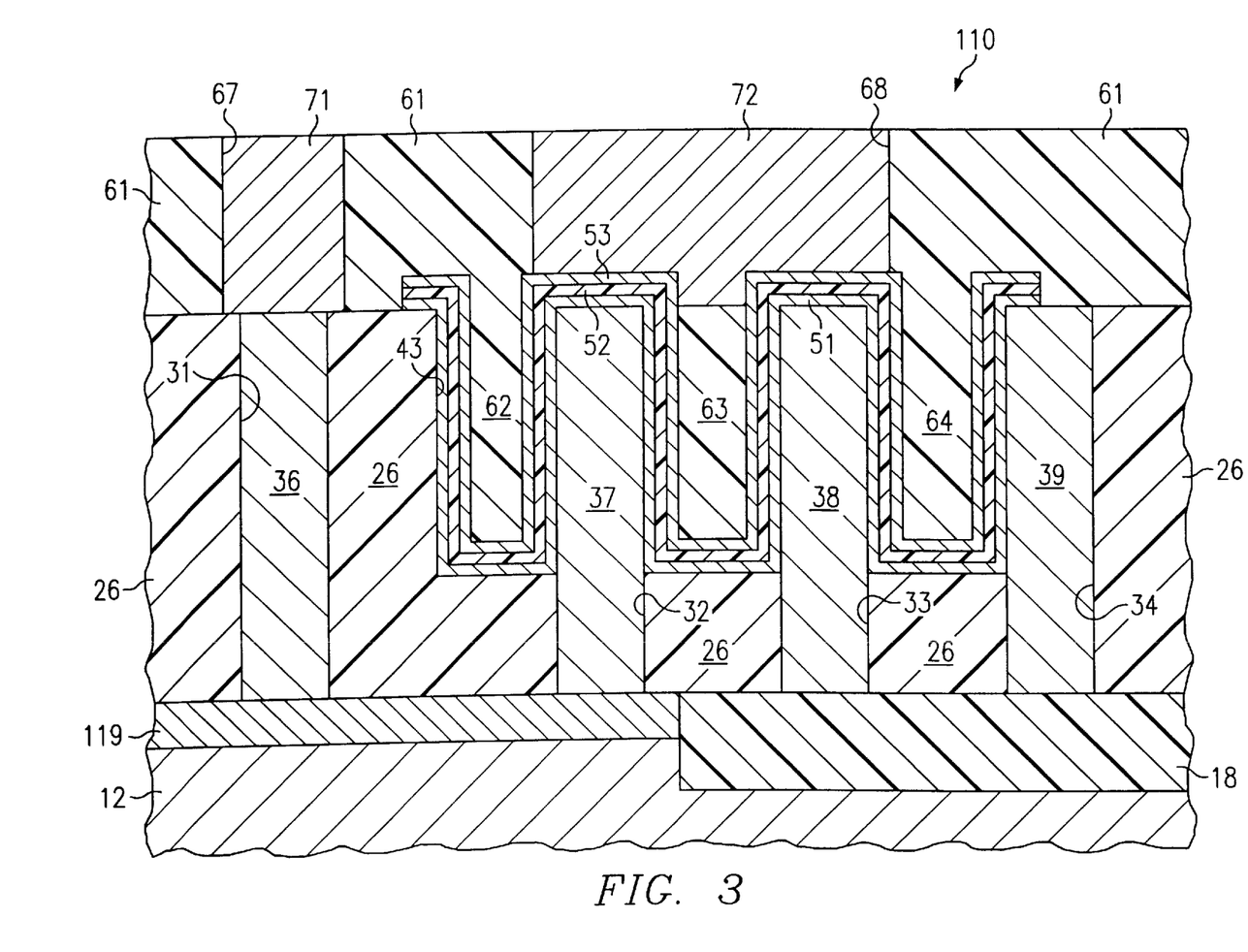
FIG. 3 is a diagrammatic fragmentary sectional side view similar to FIG. 1, but showing an integrated circuit which is an alternative embodiment of the integrated circuit of FIG. 1.

FIG. 3 is a diagrammatic fragmentary sectional side view similar to FIG. 1, but showing an integrated circuit 110 which is an alternative embodiment of the integrated circuit 10 of FIG. 1. The integrated circuit 110 of FIG. 3 is effectively identical to the integrated circuit 10 of FIG. 1, except for certain differences which are discussed below. Therefore, equivalent parts are identified by the same reference numerals, and the following discussion focuses on the differences.

More specifically, the apparatus 10 of FIG. 1 includes an FET with source and drain regions 16–17, a gate oxide layer 21, and a gate 22. The integrated circuit 110 of FIG. 3 does not include a comparable FET structure. Instead, the substrate 12 includes a diffusion resistance 119 which extends between the lower ends of the contacts 36 and 37. The resistance value and functional operation of the resistance 19 are the same as the resistance value and functional operation described above for the source-to-drain resistance of the FET in the integrated circuit 10 of FIG. 1. Although the resistance 19 in FIG. 3 is implemented in the form of a diffusion resistor, it will be recognized that it could alternatively be implemented in some other form, such as a polysilicon resistor which extends between the lower ends of the contacts 36 and 37.

Figure 4:
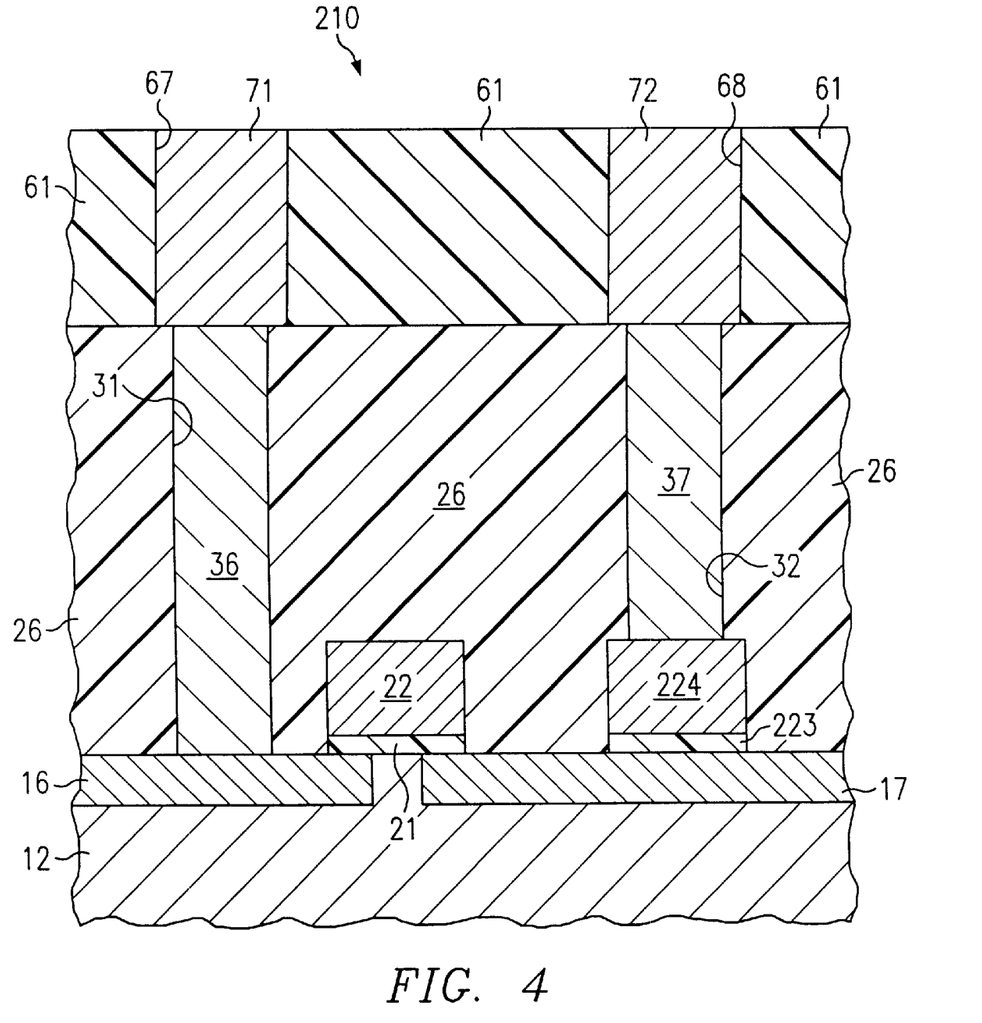
FIG. 4 is a diagrammatic fragmentary sectional side view similar to FIG. 1, but showing an integrated circuit which is yet another alternative embodiment of the integrated circuit of FIG. 1.

FIG. 4 is a diagrammatic fragmentary sectional side view similar to FIG. 1, but showing an integrated circuit 210 which is yet another alternative embodiment of the integrated circuit 10 of FIG. 1. Equivalent parts are identified with the same reference numerals, and the following discussion focuses on the differences.

More specifically, the drain region 17 is formed to be somewhat larger in the integrated circuit 210 than it was in the integrated circuit 10. Further, after a dielectric layer and polysilicon layer have been deposited on the substrate 12, in preparation to form the gate oxide layer 21 and gate 22, the patterned etch which forms the layer 21 and gate 22 is carried out so as to simultaneously form a further oxide layer 23 and a further polysilicon section 24. The oxide layer 23 is disposed on a portion of the drain region 17, at a location spaced from the gate oxide layer 21 and the gate 22.

The opening 32 in the dielectric layer 26 is created so as to expose a top surface of the polysilicon section 24, and thus the contact 37 is electrically coupled to the polysilicon section 24. The polysilicon section 24 and a portion of the drain region 17, along with the oxide layer 23 disposed therebetween, function as a voltage stiffening capacitor. This capacitor has values which are consistent with those discussed above in association the embodiment of FIG. 1. The integrated circuit 210 thus differs from the integrated circuit 10 of FIG. 1 primarily in that the physical structure of the voltage stiffening capacitor is somewhat different. But in other respects, the structure and operation of the integrated circuit 210 are essentially the same as discussed above for the integrated circuit 10 of FIG. 1. Accordingly, further discussion of the integrated circuit 210 of FIG. 4 is believed to be unnecessary here.

Figure 5:
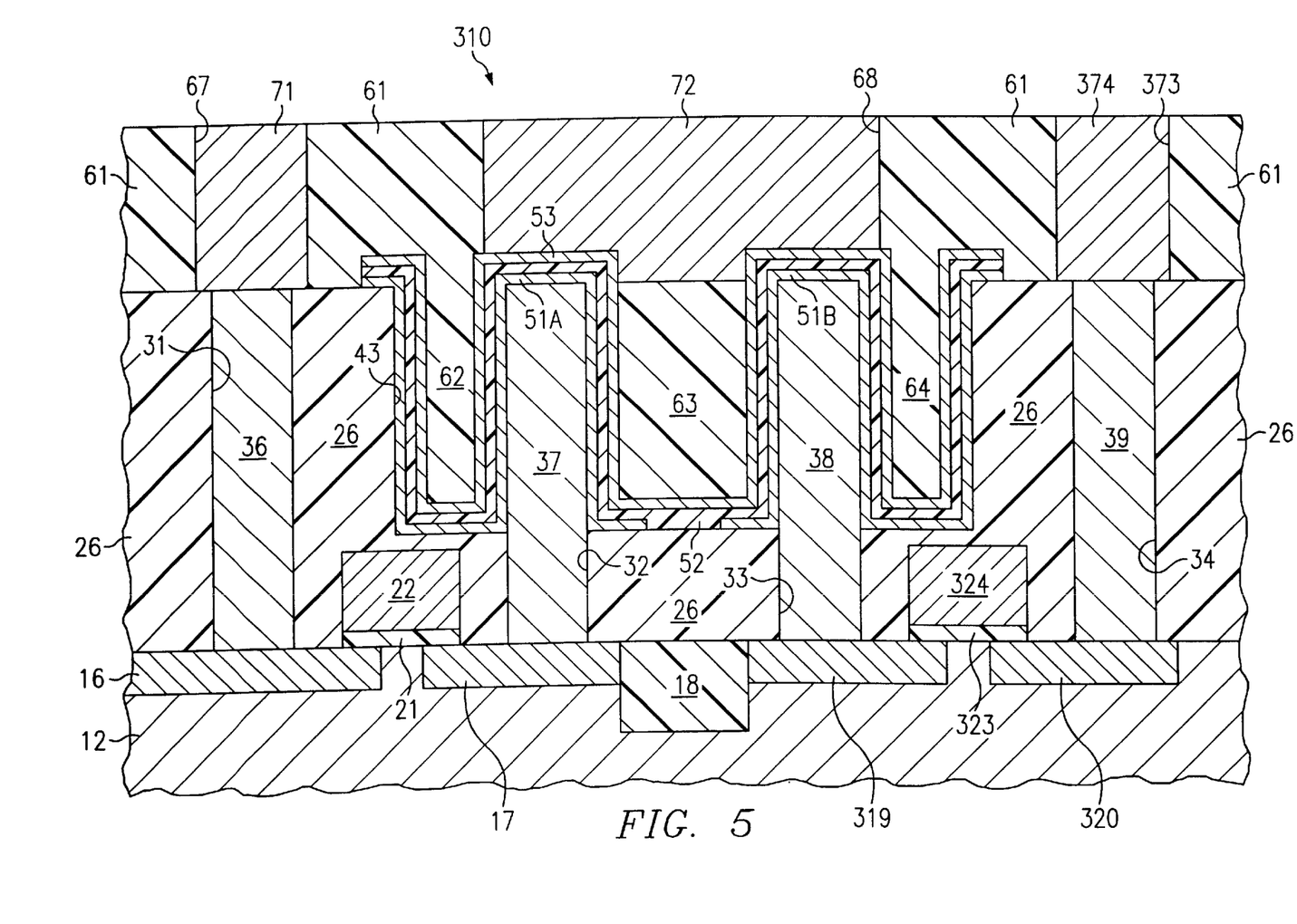
FIG. 5 is a diagrammatic fragmentary sectional side view similar to FIG. 1, but showing an integrated circuit which is still another alternative embodiment of the integrated circuit of FIG. 1.

FIG. 5 is a diagrammatic fragmentary sectional side view similar to FIG. 1, but showing an integrated circuit 310 which is still another alternative embodiment of the integrated circuit 10 of FIG. 1. Equivalent parts are identified by the same reference numerals, and the following discussion focuses on certain differences.

More specifically, referring to FIG. 5, the substrate 12 has one set of source and drain regions 16 and 17 disposed on one side of the STI region 18, and has a further set of source and drain regions 319 and 320 disposed on the opposite side of the STI region 18. The openings 31–34 in the dielectric layer 26 each expose an upper surface of a respective one of the source and drain regions 16–17 and 319–320, and the contacts 36–39 in these respective openings are thus each electrically coupled to a respective one of the source and drain region 16–17 and 319–320.

During formation of the gate oxide layer 21 and gate 22, the oxide layer and polysilicon layer covering the substrate are subjected to a patterned etch which forms not only the oxide layer 21 and gate 22, but also a further oxide layer 323 and further gate 324. The oxide layer 323 and gate 324 are centered above the area between the source and drain regions 319–320, and overlap slightly with each of the source and drain regions 319–320.

After creation of the recess 43 in the dielectric layer 26, the first of the two thin conductive layers is applied, and then this conductive layer is etched so as to form two physically and electrically separate portions 51A and 51B, which are respectively in engagement with the contacts 37 and 38. Then, the dielectric layer 52 and further conductive layer 53 are formed, so they are each disposed over both of the conductive layers 51A and 51B. Later, when the trenches 67 and 68 are etched in the dielectric layer 61, a further trench 373 is also etched in the dielectric layer 361, so as to expose the upper end of the contact 39. Consequently, during formation of the rails 71 and 72, a further rail 274 is formed in the trench 373, in electrical engagement with the upper end of the contact 39.

As evident from FIG. 5, the conductive layer portions 51A and 51B cooperate with the common dielectric layer 52 and the common conductive layer 53 so as to form two electrically separate capacitors, which are each coupled by a respective contact 37–38 to a respective source-to-drain resistance of a respective FET. In particular, one FET corresponds to the source and drain regions 16–17, oxide layer 21 and gate 22, and the other FET corresponds to the source and drain regions 319–320, oxide layer 323 and gate 324.

Figure 6:
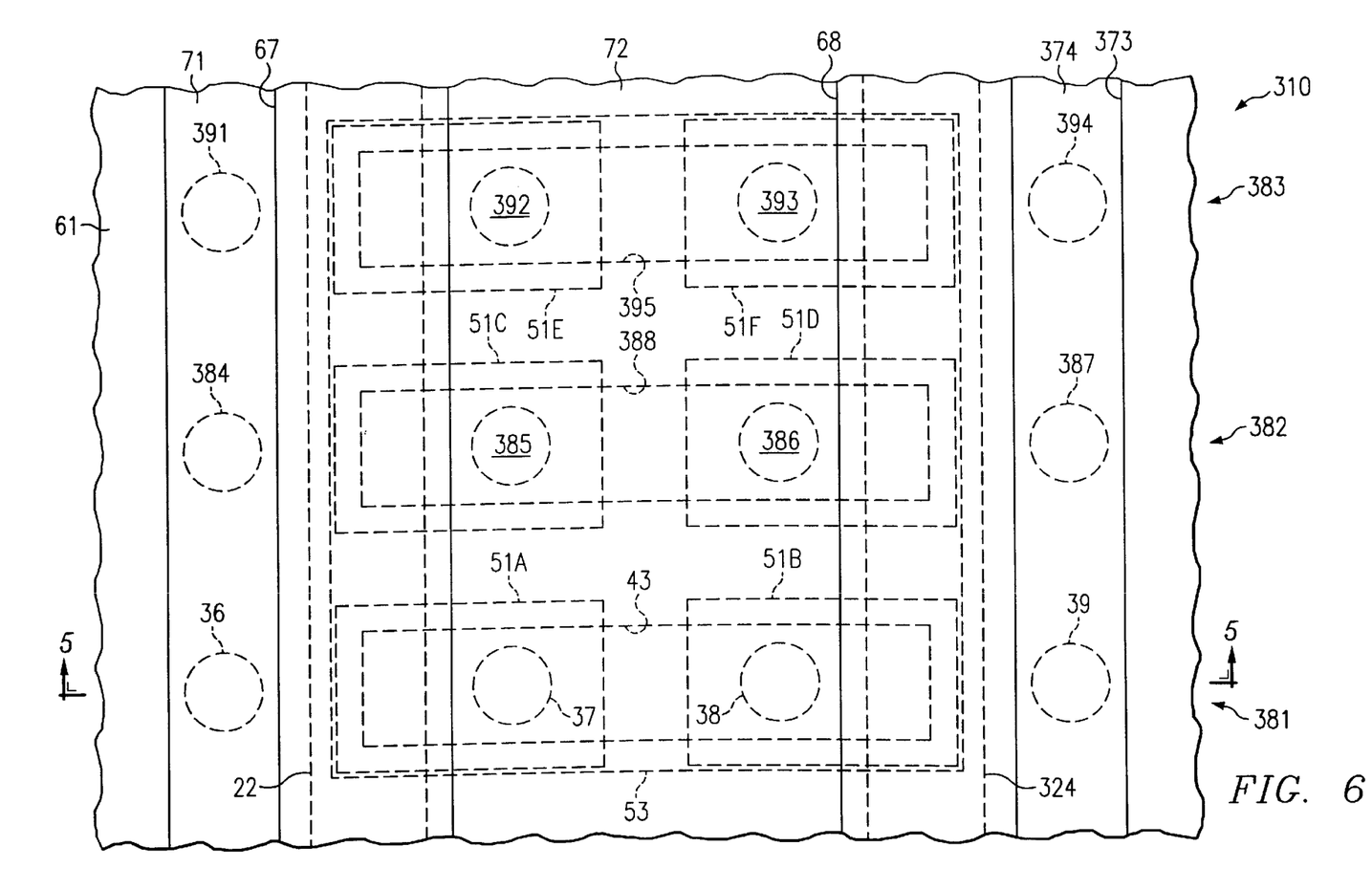
FIG. 6 is a diagrammatic fragmentary top view of the integrated circuit of FIG. 5, with a section line 5—5 which identifies the section plane of FIG. 5.

FIG. 6 is a diagrammatic fragmentary top view of the integrated circuit 310 of FIG. 5. FIG. 6 includes a section line 5—5, which identifies the section plane for the sectional view of FIG. 5. FIG. 6 shows that the illustrated portion of the integrated circuit 310 includes multiple structural arrangements of the type shown in FIG. 5. Three of these structural arrangements are respectively identified by reference numerals 381–383 in FIG. 6, where reference numeral 381 identifies the particular structural arrangement which is shown in FIG. 5.

In FIG. 6, it can be seen that the structural arrangement 382 includes four contacts 384–387 which are respectively comparable to the contacts 36–39, a recess 388 which is comparable to the recess 43, and two conductive portions 51C and 51D which are physically and electrically separate from the portions 51A and 51B, all of the portions 51A–51D being derived from a single conductive layer. Similarly, the structural arrangement 383 includes four contacts 391–394 which are respectively comparable to the contacts 36–39, a recess 395 which is comparable to the recess 43, and conductive portions 51E and 51F which are physically and structurally separate from the portions 51A–51D. The portions 51A–51F are all formed simultaneously by appropriate etching of a single conductive layer. It will be noted that the conductive layer 53 extends over all of the six conductive portions 51A through 51F. The non-conductive layer 52 is coextensive with the conductive layer 53. Thus, the conductive layer 53 is common to six capacitors which respectively correspond to the conductive portions 51A–51F.

In FIG. 6, the rail 71 is electrically coupled to the upper ends of each of the contacts 36, 384, and 391. The rail 72 is electrically coupled to the upper ends of each of the contacts 37–38, 385–386 and 392–393. The rail 374 is electrically coupled to the upper ends of each of the contact 39, 387 and 394. During use of the integrated circuit 310, the rail 71 and the rail 374 will both typically be coupled to the same voltage from the power supply. They may optionally be coupled to each other within the integrated circuit 310, by a not-illustrated conductive strip.

In FIG. 6, it will be noted that the gate 22 is an elongate strip of polysilicon material, and serves as a common gate for each of three FETs which are respectively associated with the conductive portions 51A, 51C and 51E. Similarly, the gate 324 is an elongate strip of polysilicon material, and serves as a common gate for each of three FETs which are respectively associated with the conductive portions 51B, 51D, and 51F.

Persons skilled in the art will note that the structural configuration shown in FIGS. 5 and 6 for voltage stiffening bears similarity to a known structural configuration which is used for an entirely different purpose in a dynamic random access memory (DRAM) integrated circuit, and which in particular is used to implement a capacitor and transistor pair that form the core of a DRAM memory cell. Accordingly, when the structural configuration shown in FIGS. 5 and 6 is incorporated an integrated circuit that includes a DRAM, it can be fabricated at the same time as the DRAM structure, using essentially the same process steps. Depending on the DRAM structure, the structural arrangement can be fabricated without any additional process steps, or with only a very small number of additional process steps. For example, the usual p-channel implant can be used to form a depletion mode n-channel transistor for use as a current limiting element. As another example, a standard n-channel implant can be used to form a depletion mode p-channel transistor for use as a current limiting element.

The common gate 22 may optionally be coupled to a not-illustrated fusible link of a known type, so that opening of the fusible link will cause the common gate 22 to turn off each of the three FETs associated with it, thereby disabling each of the three capacitors respectively defined by the conductive portions 51A, 51C and 51E. Similarly, the common gate 324 may optionally be coupled to a different fusible link which is not illustrated, and this link may be opened to cause the common gate 324 to turn off each of the three FETs associated with it, thereby disabling each of the three capacitors respectively defined by the conductive portions 51B, 51D, and 51F.

The present invention provides a number of technical advantages. One such technical advantage is that voltage stiffening is achieved in an effective manner in an integrated circuit by the provision between two rails of a plurality of circuit portions that each include a capacitor in series with a resistor. Each capacitor has a capacitance value which is substantially smaller than the capacitance value used for voltage stiffening in pre-existing integrated circuits, and the resistance has a value which is sufficiently large to limit the magnitude of any leakage current that may flow through the capacitor.

The capacitance and resistance values are selected so that each circuit portion has a time constant which is sufficiently small to facilitate the voltage stiffening function. In this regard, the capacitance values are significantly smaller than the capacitance values used for voltage stiffening in a pre-existing integrated circuit. This is because, when a resistance sufficient to limit leakage current is placed in series with a pre-existing voltage stiffening capacitor, the resulting time constant is so large that it precludes effective voltage stiffening.

A further advantage results where the capacitor is implemented with a three-dimensional configuration, which reduces the amount of area used in the integrated circuit to implement the capacitor. Yet another advantage exists where the resistance is implemented as the source-to-drain resistance of an FET. One aspect of this is that the resistance for voltage stiffening can be formed by substantially the same process steps used to form other FETs of the operational circuitry within the integrated circuit. Therefore, fabrication of the resistance for purposes of voltage stiffening does not add any additional process steps to the fabrication of the integrated circuit, or adds only a small number of additional process steps.

Another advantage resulting from use of an FET structure is that an FET has a current limiting characteristic which is nonlinear, in that an increase in the voltage across the FET results in an increase in current which is proportionally smaller. This means that, as the leakage current seeks to increase and thereby increase the voltage across the resistance, the non-linear voltage-to-current relationship of the source-to-drain resistance of an FET will provide a somewhat better current limiting effect than a standard resistor having a substantially linear voltage-to-current relationship. It is further advantageous when the operational circuitry in the integrated circuit includes a DRAM circuit, because the FETs and the capacitors for rail stiffening can all be formed at the same time as similar FETs and capacitors that are part of the DRAM circuitry.

Where the voltage stiffening resistance is implemented in the form of an FET, a further advantage is that the gate of the FET can be coupled to a fusible link, so that opening the link turns off the FET and thus presents the flow of any leakage current through the associated capacitor, thereby effectively removing the capacitor from the circuit. A related advantage, in the case of an integrated circuit which includes a DRAM, is that the gates of several FETs providing voltage stiffening resistances can be formed as a single conductive strip at the same time that multiple gates of the FETs in the DRAM circuit are being formed as a single conductive strip called a "word line". If the gate voltage of the transistor is controlled to be in an "off" or high resistance state in response to the detection of leakage current, then the resistance or current limiting characteristic does not need to be restrictive in the "on" or low resistance state. This helps to relieve the time constant constraints.

A further advantage is realized where each voltage stiffening capacitance is formed by a configuration which includes a source or drain region, a layer of oxide thereon, and a conductive section on the oxide layer, the oxide layer and conductive section being formed at the same time that gate oxide layers and conductive gates are formed for FETs in the operational circuitry in the integrated circuit. This permits the resistance and capacitance for voltage stiffening to be efficiently formed by the same process steps already provided to form the functional circuitry, with no additional process steps, or only a small number of additional process steps.

Although selected embodiments have been illustrated and described in detail, it will be understood that various substitutions and alterations are possible. For example, while a specific three-dimensional capacitance structure has been described, planar capacitors or other capacitance structures that enhance the capacitance per unit area may alternatively be used. Also, although the foregoing disclosure presents capacitor structures located in the region of the dielectric material below the first level of metal, capacitors may alternatively be formed in high levels of metals, or in trenches in the substrate. In addition, although the disclosed current limiting elements are located in the substrate, they could alternatively be formed in higher levels of the integrated circuit. Moreover, although a specific exemplary array structure has been disclosed, it would alternatively be possible to use other array structures. It will be understood that various other substitutions and alterations are also possible without departing from the spirit and scope of the present invention, as defined by the following claims.

What is claimed is:

1. An apparatus comprising an integrated circuit which includes:

first and second conductive parts operable to respectively carry first and second voltages which are different; and a plurality of voltage stiffening circuit portions which each have first and second nodes respectively coupled to said first and second conductive parts, each of said circuit portions including a capacitance and a current limiting section coupled in series with each other between said first and second nodes thereof, each said current limiting section being selected so that application across said current limiting section of a voltage equal to the difference between said first and second voltages would induce through said current limiting section a current flow less than approximately 10 mA.

2. An apparatus according to claim 1, wherein said current limiting section has a value selected so that application across said current limiting section of a voltage equal to the difference between said first and second voltages would induce through said current limiting section a current flow less than approximately 1 µA.

3. An apparatus according to claim 1, wherein each said current limiting section is a resistance having a value greater than approximately 800 ohms.

4. An apparatus according to claim 1, wherein each said capacitance has a value less than approximately 100 fF.

5. An apparatus according to claim 4, wherein each said capacitance has a value in the range of approximately 1 fF to approximately 20 fF.

6. An apparatus according to claim 1, wherein said capacitances of said circuit portions all have approximately the same value.

7. An apparatus according to claim 1, wherein each said current limiting section includes a diffusion resistor.

8. An apparatus according to claim 1, wherein each said circuit portion has a time constant which is less than approximately 10 nanoseconds.

9. An apparatus according to claim 8, wherein each said circuit portion has a time constant which is less than approximately 20 picoseconds.

10. An apparatus according to claim 1, including a power supply section which is coupled to each of said first and second conductive parts and which has a time constant, each of said circuit portions having a time constant which is less than said time constant of said power supply section.

11. An apparatus according to claim 1, wherein each said circuit portion includes a transistor which serves as said current limiting section.

12. An apparatus according to claim 11, wherein said transistor is a depletion mode transistor.

13. An apparatus according to claim 1, wherein said integrated circuit includes a substrate, and wherein each said circuit portion includes:

spaced first and second locations on said substrate;

a portion of said substrate which extends between said first and second locations and which implements the current limiting section of the circuit portion;

first and second conductive contacts respectively coupled to said substrate at said first and second locations; and a capacitor having a capacitance which provides the capacitance of the circuit portion and which includes first and second conductive layers separated by a non-conductive layer, said first conductive layer being electrically coupled to one of said first and second contacts, said second conductive layer being electrically coupled to one of said first and second conductive parts, and the other of said first and second conductive parts being electrically coupled to one of said first and second contacts other than said contact coupled to said first conductive layer.

14. An apparatus according to claim 13, wherein for each said circuit portion, said portion of said substrate extending between said first and second locations includes a diffusion resistor which serves as said current limiting section.

15. An apparatus according to claim 13, wherein each said circuit portion of said integrated circuit includes a transistor which serves as said current limiting section and which has:

spaced source and drain regions disposed in said substrate with respective portions thereof respectively disposed at said first and second locations; and a conductive gate section extending over said substrate between said source and drain regions.

16. An apparatus comprising an integrated circuit which includes:

first and second conductive parts operable to respectively carry first and second voltages which are different; and a plurality of voltage stiffening circuit portions disposed within a contiguous area of said integrated circuit which is free of circuitry other than said circuit portions, said circuit portions each having first and second nodes respectively coupled to said first and second conductive parts, and each including a capacitance and a current limiting section coupled in series with each other between said first and second nodes thereof.

17. A method of fabricating an integrated circuit which includes first and second conductive parts operable to respectively carry first and second voltages that are different, and a plurality of voltage stiffening circuit portions that each have first and second nodes respectively coupled to said first and second conductive parts, each of said circuit portions including a capacitance and a resistance coupled in series with each other between said first and second nodes thereof, comprising the steps of:

providing a substrate;

forming in said substrate a portion which extends between spaced first and second locations on said substrate and which implements said resistance;

forming an insulating layer over said substrate;

forming first and second openings in said insulating layer which respectively extend to said first and second locations;

forming conductive first and second contacts in said first and second openings, said first and second contacts being respectively electrically coupled to said substrate at said first and second locations;

forming in said insulating layer a recess which is spaced from said substrate, one of said first and second contacts having an upper portion which projects into said recess and the other of said contacts being spaced from said recess;

forming on exposed surfaces of said recess and said one of said contacts a first conductive layer;

forming a non-conductive layer on said first conductive layer;

forming a second conductive layer on said nonconductive layer, said first and second conductive layers and said non-conductive layer collectively forming a capacitor which provides said capacitance of the circuit portion; and forming said first and second conductive parts so that one thereof is electrically coupled to said second conductive layer and the other thereof is electrically coupled to the other of said first and second contacts.

18. A method according to claim 17, wherein said step of forming said portion in said substrate includes the step of forming a diffusion resistor in said substrate.

19. A method according to claim 17, wherein said step of forming said portion in said substrate includes the step of forming spaced source and drain regions in said substrate which respectively have portions at said first and second locations; and including the step of forming a conductive gate section which extends over said substrate between said source and drain regions.

* * * * *